United States Patent [19]
Feit et al.

[11] Patent Number: 5,119,388
[45] Date of Patent: Jun. 2, 1992

[54] LOW TUNING RATE PBTE/PBEUSETE BURIED QUANTUM WELL TUNABLE DIODE LASERS AND ARRAYS

[75] Inventors: Zeev Feit, Brookline, Mass.; Douglas Kostyk, Hudson, N.H.; Robert J. Woods, Burlington, Mass.

[73] Assignee: Laser Photonics, Inc., Orlando, Fla.

[21] Appl. No.: 616,365

[22] Filed: Nov. 21, 1990

Related U.S. Application Data

[60] Continuation-in-part of Ser. No. 468,842, Jan. 23, 1990, Pat. No. 5,028,563, which is a division of Ser. No. 314,977, Feb. 24, 1989, Pat. No. 4,943,971.

[51] Int. Cl.$^5$ .............................................. H01S 3/19
[52] U.S. Cl. ...................................... 372/46; 372/45; 372/50; 357/16; 437/129
[58] Field of Search .................... 372/44, 45, 46, 50; 357/16, 17; 437/129

[56] References Cited

U.S. PATENT DOCUMENTS

| | | | |
|---|---|---|---|
| 4,121,177 | 5/1988 | Tsukada | 437/107 |
| 4,190,813 | 2/1980 | Logan et al. | 437/129 |
| 4,230,997 | 10/1980 | Hartman et al. | 437/129 |
| 4,366,568 | 12/1982 | Shimizu et al. | 437/129 |
| 4,603,420 | 7/1983 | Nishizawa | 372/45 |
| 4,608,694 | 8/1986 | Partin | 372/44 |
| 4,612,644 | 9/1986 | Partin | 372/44 |
| 4,747,108 | 5/1988 | Partin | 372/44 |

FOREIGN PATENT DOCUMENTS

| | | |
|---|---|---|
| 54-157093 | 12/1979 | Japan . |
| 57-078192 | 8/1982 | Japan . |
| 0207388 | 12/1982 | Japan .............. 437/129 |
| 0010884 | 1/1983 | Japan .............. 437/129 |
| 59-047791 | 6/1984 | Japan . |
| 0129473 | 7/1984 | Japan .............. 437/129 |
| 0208884 | 11/1984 | Japan .............. 437/129 |
| 0208885 | 11/1984 | Japan .............. 437/129 |
| 60-193394 | 1/1985 | Japan . |
| 61-194887 | 8/1986 | Japan . |
| 5102287 | 8/1990 | Japan . |
| 2109155 | 5/1983 | United Kingdom .............. 437/129 |

OTHER PUBLICATIONS

Partin, "Heterojunction stripe geometry lead salt diode lasers grown by molecular beam epitaxy", Optical Engineering, vol. 24, No. 2, Mar.-Apr. 1985, pp. 367-370.

Kasemset, "Longitudinal Mode Behavior of PbSnTe Buried Heterostructure Lasers", Appl. Phys. Lett., 30(H), Dec. 1, 1981, pp. 72-74.

Kishino, et al., "Mesa Substrate Buried Heterostructure GaInAsP/InP Lasers . . . ", IEEE J. Quan. Electron, vol. QE-16, No. 2, Feb. 1980.

Ianaka, et al., "Double-Heterostructure Lasers Fabricated by Molecular Beam Epitaxy", Jpn. J. Appl. Phys., vol. 24, No. 2, Feb. 1985.

Tacke, Spanger, Lambrecht, Norton, Bottner, "Infrared double-heterostructure diode lasers made by molecular beam epitaxy of Pbl-xEuxSe", Applied Physics Letters, vol. 53, No. 23, Dec. 5, 1988.

Partin, Thrush, "Wavelength coverage of lead-europium-selenide diode lasers", Appl. Phys. Lett., Aug. 1, 1984.

Kasemset, Rotter, Fonstad, "Pbl-xSnxTe/PbTel-ySey Lattice Matched Buried Heterostructure Lasers with CW Single Mode Output", IEEE Electronic Device Letters, vol. EDL-1, No. 5, May, 1980.

Tempkin, et al., "High-Speed Distributed Feedback Laser . . . ", App. Phys. Lett. 53(13), Sep. 26, 1988, pp. 1156-1158.

(List continued on next page.)

*Primary Examiner*—Georgia Y. Epps
*Attorney, Agent, or Firm*—Testa, Hurwitz & Thiebeault

[57] ABSTRACT

A PbTe/PbEuSeTe buried quantum well diode laser and array and the method for making the same. The quantum well active region layer is buried between electrical and optical confinement regions which have an energy band gap greater than the active buried layer and an index of refraction less than the active layer. The buried structure enhances electrical and optical confinement, reduces threshold currents, and provides a stable single mode laser. The buried laser and array are produced using a two-step molecular beam epitaxy method.

10 Claims, 3 Drawing Sheets

OTHER PUBLICATIONS

Partin, "Lead Salt Quantum Well Diode Lasers", Superlattices and Microstructures, vol. 1, No. 2, 1985.

Partin, "Lead-Europium-Selenide-Telluride Grown by Molecular Beam Epitaxy", Journal of Electronic Materials, vol. 13, No. 3, 1984.

Yoshikawa, Shinohara, Ueda, "Continuous Operation over 1500 h of a PbTe/PbSnTe double-heterostructure laser at 77K", Applied Physics Letters, vol. 31, No. 10, Nov. 15, 1977.

Feit, Woods, Kostyk, Jalenak, "Low-threshold PbEuSeTe double-heterostructure lasers grown by molecular beam epitaxy", Appl. Phys. Lett., Jul. 3, 1989.

Partin, "Lead Salt Quantum Effect Structures", IEEE Journal of Quantum Electronics, vol. 24, No. 8, Aug. 8, 1988.

Partin, Heremans, Thrush, "Side Optical Cavity, Single Quantum Well Diode Laser", Superlattices and Microstructures, vol. 2, No. 5, 1986.

Feit, Kostyk, Woods, Mak, "Molecular beam epitaxy grown PbEuSeTe buried-heterostructure lasers with continuous wave operation at 195K", Appl. Phys. Lett., Dec. 31, 1990.

Linden, Mantz, "Tunable diode laser systems for the 3-30um infrared spectral region", SPIE Proceedings, Jan. 26-28, 1982, vol. 320.

Anderson, "Gain-Frequency-Current Relation for Pb1-xSnxTe Double Heterostructure Lasers", IEEE Journal of Quantum Electronics, Jul. 1977, vol. QE-13, No. 7.

LOW TUNING RATE PBTE/PBEUSETE BURIED QUANTUM WELL TUNABLE DIODE LASERS AND ARRAYS

This application is a continuation-in-part of application Ser. No. 07/468,842, filed Jan. 23, 1990 U.S. Pat. No. 5,028,563, which in turn was a division of U.S. Pat. No. 4,943,971, filed Feb. 24, 1989, issued Jul. 24, 1990.

FIELD OF THE INVENTION

The invention relates to lead salt semiconductor diode lasers, and more particularly, to lead chalcogenide buried quantum well laser diodes and laser arrays, and the method for making the same.

BACKGROUND OF THE INVENTION

A semiconductor diode laser is a monocrystalline pn junction device. In one form of such a device, the pn junction is in a plane disposed in an active region between two parallel rectangular faces of a monocrystalline semiconductor body. Two mutually parallel reflective faces that are perpendicular to the pn junction form a laser cavity. Lasing action is produced by applying a forward voltage across the pn junction, which causes electrons and holes to be injected across the junction, where they recombine and cause a stimulated emission of radiation. Above a given level of electron injection, called the threshold current, the emitted radiation is collected and amplified in the active region. The amplified radiation exits the active region parallel to the pn junction as a monochromatic beam.

Several factors can reduce the laser's efficiency, and hence its output power. One problem is that some electrons and holes which are injected into the active region do not stimulate emission therein. This occurs, for example, when the electron or hole escapes to outside the active region to adjacent portions of the semiconductor body, where it recombines without contributing to laser emission. Similarly, photons produced in the active region can escape from the active region by radiation in a direction not parallel to the pn junction. In addition, some electrons disappear within the active region without producing the desired emission of radiation, such as when they recombine with holes at crystal defects. Sandwiching the active region between two contiguous layers of monocrystalline semiconductive material having a larger energy band gap and lower index of refraction than the active region, restricts escape of injected electrons and holes and stimulated photons. Lead-europium selenide-telluride laser devices of this type are known. Because the active layer in these devices is not entirely surrounded by the contiguous layers, i.e., is not buried, these devices are known to operate in single mode only for currents restricted to less than twice the threshold current. In addition, these devices are known to have relatively noisy single mode behavior, relatively short tuning per mode, relatively narrow spaced modes, and to be less stable than desired. Moreover, the known sandwiched devices are produced in a relatively complicated procedure, utilizing (1) a one-step molecular beam epitaxy (MBE) process during which each of the various layers are grown onto the substrate, (2) a photolithographic process to form a mesa with the active layer between the confinement and buffer layers, (3) a native oxide passivation process, and (4) a two step metalization.

Single quantum well PbEuSeTe diode lasers using a mesa stripe geometry have been reported. A large optical cavity single quantum well laser with a PbTe single quantum well active layer and PbEuSeTe confinement layers demonstrated improved CW operating temperatures. A modified side optical cavity single quantum well laser structure resulted in lower threshold currents, along with increasing CW operating temperatures up to 175 K.

Buried heterostructure $Pb(1-x)Sn(x)Te/PbTe(1-y)Se(y)$ lasers are known which are fabricated by a two-step liquid phase epitaxy (LPE) technique which does not allow the creation of buried heterostructure lasers or arrays which incorporate europium, strontium or calcium. The inclusion of these materials is important, however, to obtain stable lasers at certain infrared frequencies.

SUMMARY OF THE INVENTION

A buried heterostructure laser and array, and the method for making the same are disclosed. An active layer of PbEuSeTe is entirely surrounded with larger band gap PbEuSeTe cladding layers. The laser and array are produced in a two-step MBE process. During the first step of the MBE process, buffer, first cladding and active layers are grown. The sample is then removed from the MBE system for a microproduction step including etching and surface preparation. The sample is then returned to the MBE system for the growth of a second cladding layer and a capping layer. An ohmic contact is then evaporated onto the top and bottom surfaces.

With the present invention, no micro production step is necessary after the heterostructure has been fully grown, and the lasers can be cleaved immediately after metalization. This method reduces the number of production steps while at the same time improving the properties of the laser.

A laser produced in the manner of the present invention has better single mode operation, and has low thresholds even at high operational temperatures. In addition, the buried laser of the type disclosed herein has lower tuning rates and higher degrees of tunability. The present invention provides buried heterostructure laser diodes which use europium, calcium, tin or strontium, and which thus work in specific frequency regions which have not been obtainable previously with buried waveguide structures.

Laser arrays are also easily producible with the present invention. A buried heterostructure array has the ability to couple between individual emitters.

A buried quantum well PbEuSeTe/PbTe laser is also disclosed with optical and electrical confinement regions. Because the thickness of the quantum well active layer is so thin, the surface preparation step described above with reference to the buried heterostructure device may damage the active layer of the quantum well laser. One way to avoid this damage is to have part of the confinement layer grown over the active region during the first growth stage. The remainder of this confinement layer could then be added during the second growth stage.

DESCRIPTION OF THE DRAWINGS

The invention will be more fully understood from the following detailed description, taken in conjunction with the accompanying drawings, in which.

DETAILED DESCRIPTION OF THE INVENTION

Figure 1:
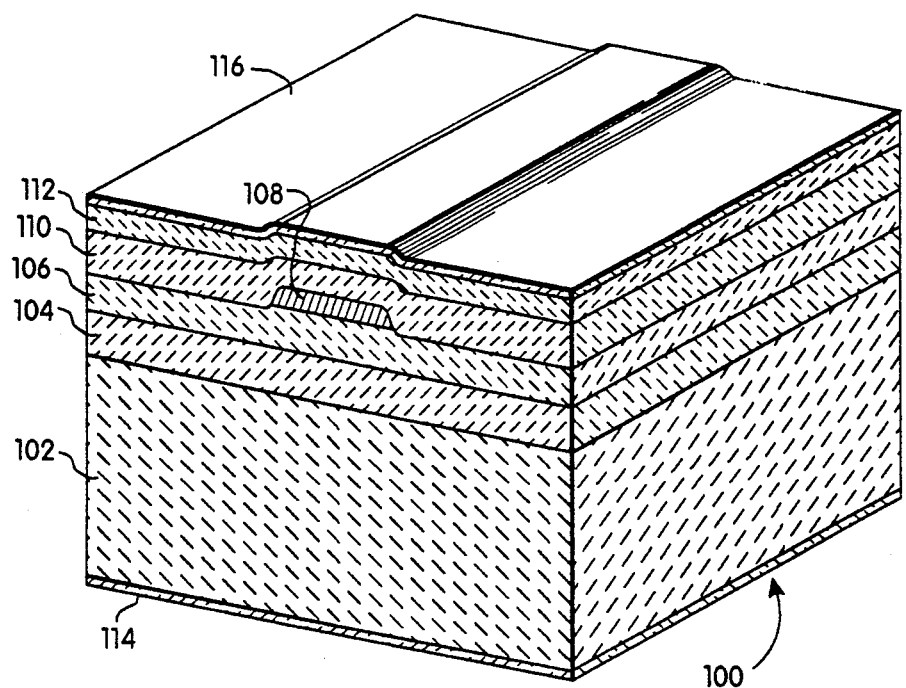
FIG. 1 is a sectional view of a lead salt buried diode laser element made in accordance with the present invention.
Figure 2:
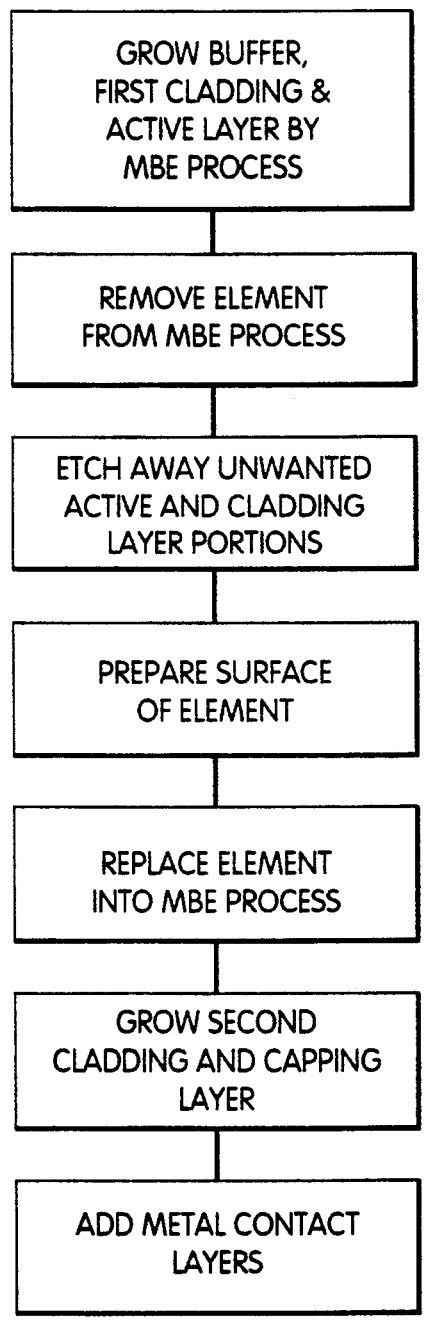
FIG 2 is a flow chart showing the steps of manufacturing the diode laser of the present invention.

With reference to FIGS. 1 and 2, an infrared heterojunction lead salt laser diode having a lead-europium-selenide-telluride confinement region, and the method for making the same is disclosed. In other specific examples, other compositions such as europium/calcium or strontium/calcium may be used. Alternatively, tin may be added to the active region layer to make a longer emission wavelength laser.

FIG. 1 depicts a semiconductor diode laser element 100 built on a monocrystalline lead telluride (PbTe) substrate 102. Substrate 102 has a p=type doping of about $2 \times 10^{19}$ holes per cubic centimeter. The crystal structure is face centered cubic and the lattice constant is about 6.460 angstroms (Å).

Above this substrate 102, a buffer layer 104 of PbTe doped with thallium is grown. This layer is typically 1 to 1½ microns thick. The buffer layer 104 is added to partially mask crystal imperfections that may arise at the interface between a first cladding (or confinement) layer 106 and the substrate 102. The use of a buffer layer is known in the art, and need not be included to achieve the benefits of the disclosed invention.

A first cladding layer 106 of Pb(1-x)Eu(x)Se(y)-Te(1-y) is deposited onto the buffer layer 104, if the buffer layer is used, or otherwise directly onto the substrate 102. The values of x and y are typically $0 <= x <= 0.04$, and $0 <= y <= 0.06$. It can be see that the cladding layer 106 differs from the buffer layer 104 and the substrate layer 102 in that it also contains europium and selenium. Nevertheless, the cladding layer 106 remains monocrystalline with a face centered cubic crystal structure with a lattice constant of about 6.460 angstroms. The interface between the cladding layer 106, the buffer layer 104 and the substrate 102 presents no significant electrical resistance. Rather than being a europium/selenide containing layer, this layer can instead contain strontium and calcium, for example.

The cladding layer 106 is made to have a p-type conductivity, being given a p-type dopant concentration of approximately $10^{19}$ holes per cubic centimeter. In the preferred example, the doping is accomplished using thallium, although other doping materials known in the art could also be used. The cladding layer 106 is also preferable 1 to 1½ microns thick, but typically may be of other dimensions (such as 1 to 2 microns).

An active layer 108 is grown onto the first cladding layer 106 during the first step of the two-step MBE process. The active layer is preferably ¾ micron thick.

After the active layer 108, the first cladding layer 106, and if desired, the buffer layer 104, have been grown onto substrate 102, the entire element is removed from the MBE chamber. Portions of the active layer 108 and cladding layer 106 are etched away by methods well known in the art, so as to leave behind only the waveguide portion of the active layer. While the length width and depth of the etching depend on the characteristics of the desired laser, by way of example, they can provide an active layer of 4–8 microns width. After the etching step necessary to create the waveguide, the surface of the element is prepared with a surface preparation electrochemical etchant such as $Na_2S_3$:KOH: Glycerol, for continuation of the MBE process. The element 100 is then replaced in the MBE chamber, and growth of additional layers is begun. First, a second cladding layer 110, which is a blanket epitaxial layer of n-type Pb(1-x)Eu(x)Se(y)Te(1-y), is grown on the upper surface of the element 100. It preferably has a thickness of approximately 1½ microns, and as seen in FIG. 1, it covers the entire active region layer.

The growth of layer 110 is followed by an optional capping layer 112 having a thickness of approximately ¾ microns. As discussed above with reference to the buffer layer 104, the capping layer 112 is optional, and is used to provide a stable contacting layer.

The upper two layers 110 and 112 ar doped to n-type conductivity, having an n-type impurity concentration of about $10^{19}$ electrons per cubic centimeter. The interface between the upper portion of the p-type layer and the lower portion of the n-type layer forms a pn junction. The cladding layers function as an electron, hole, and photon confinement layer for the active layer 108.

The second cladding layer is a second europium/selenium or strontium/calcium containing semiconductive lead chalcogenide layer that is similar in composition and properties to the lower lead chalcogenide semiconductive layer except for the difference in doping. Like the lower lead chalcogenide semiconductor layer, the upper layer has a face centered cubic crystal lattice having a lattice constant of about 6.460 angstroms. Both of the layers have an energy band gap that is higher and an index of refraction that is lower than that of the active region layer, and hence, they can provide good carrier and optical confinement.

Dopants used in the substrate and the various layers can be the same as those conventionally used in making any lead salt semiconductor diode laser. For example, one can dope to n-type conductivity by using an excess of lead in the semiconductor composition or by including appropriate quantities of bismuth, gallium, indium or cadmium atoms in the layer. They can be included as grown, by ion implantation, or by diffusion. Analogously, p-type doping can be done be adding an excess of tellurium or by including thallium, silver, sodium or potassium in the semiconductor composition. Normally, one would want to use a dopant that has a very low diffusion constant to assure that the pn junction is not only abrupt as formed but remains so during use. In most instances, it is preferred to dope the various layers as formed rather than subsequently by diffusion.

Top ohmic contact 116 is then placed on the top epitaxial layer of the device, by means of evaporation techniques will known in the art. In a preferred embodiment, gold is first evaporated onto the surface, followed by one evaporation of nickel. The nickel is added to the gold contact to provide a barrier to prevent diffusion of indium from the packaging with the gold contact layer. The wafer is then thinned to the desired thickness and the bottom contact 114 is then put into the substrate side of the wafer. The wafer is then cleaved and packaged in processes known for use with any diode device.

Figure 3:
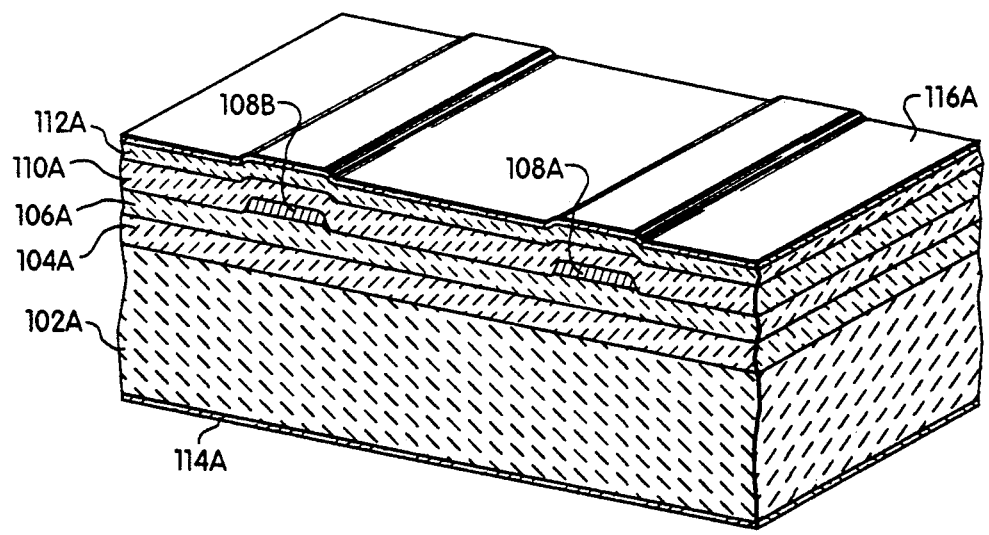
FIG. 3 is a sectional view of a diode laser array made in accordance with the present invention.

With reference to FIG. 3, the present invention is also suitable for creating laser diode arrays. In such an array, a plurality of active regions 108A and 108B are buried between first cladding layer 106A and a second cladding layer 110A. Buffer layers 104A and 112A, and ohmic contacts 116A and 114A serve the same functions as described with reference to FIG. 1. The array is manufactured in a manner similar to the single diode, only with the etching process resulting in a plurality of waveguides. The buried array provides higher power output than a single laser diode, approximately proportional to the number of elements in the array. The buried array provides the possibility of coupling modes, which is not generally possible with a sandwiched array.

In another embodiment of the invention, the active layer of the buried laser device has a quantum layer thickness of less than about 1200 Å, and is typically in the range of 300 to 1000 Å. At these dimensions, the energy band gap of the active layer arises from quantum effects. Such a quantum well active region may provide a more efficient device, with more power and better mode structures.

Figure 4:
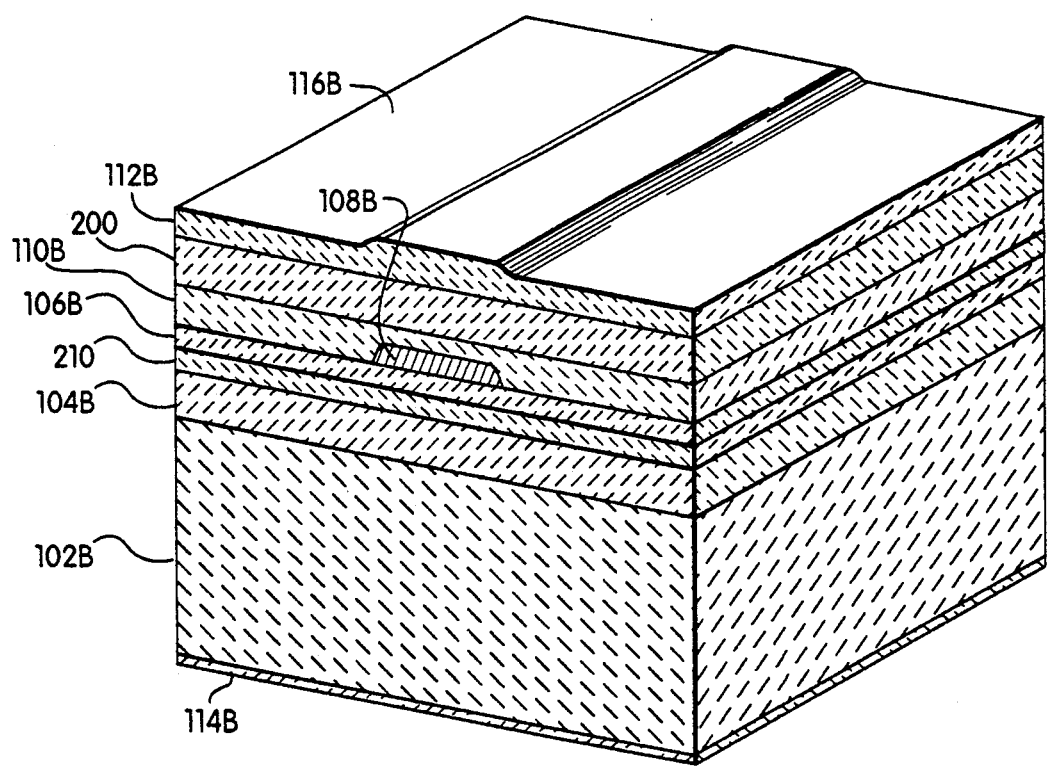
FIG. 4 is a sectional view of a buried quantum well laser element made in accordance with the present invention.

One particular embodiment of a buried quantum well laser in accordance with the present invention is shown in FIG. 4. The quantum well laser comprises a capping layer 112B, a substrate 102B, a buffer layer 104B, and top and bottom ohmic contacts 114B and 116B, similar to those described with reference to FIG. 1. Rather than the one cladding (or confinement) region described above with reference to the buried heterostructure, the buried quantum well laser may have two confinement regions surrounding the active region 108B. A first confinement region having an upper layer 110B and a lower layer 106B primarily provides electrical confinement. A second confinement region having an upper layer 200 and a lower layer 210 primarily provides optical confinement. The upper and lower layers of the confinement regions typically should be of the same type of material, but with opposite conductivity, and are preferably between $\frac{1}{2}$ and $2\mu$ in thickness, although other dimensions may be used in conformance with this invention.

The active region and the first and second confinement regions can be described as having the chemical composition $Pb(1-x)M(x)Se(1-y)Te(y)$, where $0 < = x < 1$, and $0 < = y < 1$, and where M is one of the elements Eu, Ca, Sr, Sn or Ge. In addition, if the percentage of M (excluding Sn) in the active region is described as $M_0$, the percentage of M in the first confinement region is described as $M_1$, and the percentage of M in the second confinement region is described as $M_2$, then $M_0 < M_1 < = M_2$. That is, the percentage of M in the active region should be less than the percentage of M in either of the two confinement regions. For Sn these relations are inversed.

Although FIG. 4 shows the two confinement regions having both upper and lower layers, it is not necessary to have four separate layers. Two confinement layers are necessary only on at least one side of the active region. That is, although $M_1$ can equal $M_2$ on one side of the active region, $M_1$ cannot equal $M_2$ on both the upper and lower sides. In addition, the change in percentage of $M_1$ and $M_2$ between the two confinement regions can be by step changes or graded, as is well known to those in the art.

Because the thickness of the quantum well active region is so thin, the surface preparation step described above with reference to the buried heterostructure device may damage the active layer of the quantum well laser. One way to avoid this damage is to have part of confinement layer 110B grown during the first growth stage, so that the stripe definition and the surface preparation described above can be done on a portion of that layer instead of on the quantum well active layer. The remainder of the confinement layer could then be added during the second growth stage.

The active region of the quantum well device may be a single quantum structure, or multiple quantum structures formed by alternating the percentages of $M_0$ and $M_1$, as would be known to those skilled in the art. Similarly, as described above with reference to buried heterostructure devices, arrays of the buried quantum well device may be developed. Also, with the disclosed invention, the active quantum region layer can be strained to affect the band structure.

As is apparent from the present description, other modifications and alternative implementation will occur to those versed in the art without departing from the true spirit and scope of the invention. Accordingly, it is not intended to limit the invention to what has been particularly shown and described except as indicated in the appended claims.

What is claimed:

1. A buried quantum well diode laser comprising:
   first and second ohmic contacts, and
   a resonant cavity comprising first and second parallel faces located between said first and second ohmic contacts and built upon a lead salt substrate, said resonant cavity further comprising a semiconductor monocrystalline lead salt active region having a given energy band gap arising from quantum effects, index of refraction, crystal structure and lattice constant, buried between a semiconductor monocrystalline lead salt confinement region comprising two layers of mutually opposite conductivity type and having an energy band gap greater than, an index of refraction smaller than, and a lattice constant substantially equal to those of said active region.

2. The diode laser of claim 1, wherein said active region comprises $Pb(1-x)M(x)Se(1-y)Te(y)$, where M is Eu, Ca, Sr, Sn or Ge, and $0 < = x < 1$; and $0 < = y < 1$.

3. The diode laser of claim 2, further comprising a second semiconductor monocrystalline lead salt confinement region comprising two layers of mutually opposite conductivity type and having an energy band gap greater than, an index of refraction smaller than, and a lattice constant substantially equal to those of said active region layer.

4. The diode laser of claim 3, wherein said confinement regions comprise $Pb(1-x)M(x)Se(1-y)Te(y)$ where M is Eu Ca Sr or Ge, and $0 < = x < 1$; and $0 < = y < 1$, and wherein the percentage of M in the active region is less than the percentage of M in said first confinement region, and wherein the percentage of M in said first confinement region is less than the percentage of M in said second confinement region.

5. The diode laser of claim 4, wherein said active region is less than 1200 Å thick.

6. The diode laser of claim 3, wherein said confinement regions comprise $Pb(1-x)M(x)Se(1-y)Te(y)$, where M is Sn, and $0 < = x < 1$; and $0 < = y < 1$, and wherein the percentage of M in the active region is greater than the percentage of M in said first confinement region, and wherein the percentage of M in said first confinement region is greater than the percentage of M in said second confinement region.

7. A buried quantum well diode laser comprising:

first and second ohmic contacts, and a resonant cavity comprising first and second parallel faces located between said first and second ohmic contacts and built upon a lead salt substrate, said resonant cavity further comprising a semiconductive monocrystalline lead salt quantum well active region of given energy band gap arising from quantum effects, index of refraction, crystal structure and lattice constant, buried between a first semiconductive monocrystalline lead salt layer of one type of conductivity type comprising one element selected from the group Eu, Ca, Sr, Sn and Ge, and having an energy band gap higher than, an index of refraction lower than, a crystal structure the same as, and a lattice constant substantially equal to said active region and a second semiconductive monocrystalline lead salt layer having a type of conductivity type opposite to that of said first semiconductive layer and comprising one element selected from the group Eu, Ca, Sr, Sn and Ge, and having an energy band gap higher than, an index of refraction lower than, a crystal structure the same as, and a lattice constant substantially equal to said active region.

8. The diode laser of claim 7, wherein said active region comprises $Pb(1-x)M(x)Se(1-y)Te(y)$, where M is Eu, Ca, Sr, Sn or Ge, and $0<=x<1$; and $0<=y<1$.

9. The diode laser of claim 8, further including a third semiconductive monocrystalline lead salt confinement layer of one type of conductivity type comprising one element selected from the group Eu, Ca, Sr, Sn and Ge, wherein said selected element is the same as the element selected for the first and second lead salt layers.

10. A buried quantum well diode laser comprising:

first and second ohmic contacts, and a resonant cavity comprising first and second parallel faces located between said first and second ohmic contacts and built upon a lead salt substrate, said resonant cavity further comprising a semiconductor monocrystalline lead salt active region comprised of $Pb(1-x)M(x)Se(1-y)Te(y)$, where M is Eu, Ca, Sr, Sn or Ge, and $0<=x<1$; and $0<=y<1$, said active region having a thickness of less than 1200 Å, wherein said active region is buried between a first confinement region comprising a first and second layer of mutually opposite conductivity type and having a higher percentage of M than said active region, and a second confinement region comprising at least a third layer having a higher percentage of M than said first confinement region.

* * * * *